United States Patent
Jin et al.

(10) Patent No.: US 10,100,436 B2
(45) Date of Patent: Oct. 16, 2018

(54) METHOD FOR MAKING GALLIUM NITRIDE EPITAXIAL LAYER BY SILICON SUBSTRATE

(71) Applicants: Tsinghua University, Beijing (CN); HON HAI PRECISION INDUSTRY CO., LTD., New Taipei (TW)

(72) Inventors: Yuan-Hao Jin, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/792,889

(22) Filed: Oct. 25, 2017

(65) Prior Publication Data
US 2018/0195204 A1     Jul. 12, 2018

(30) Foreign Application Priority Data
Jan. 10, 2017    (CN) .......................... 2017 1 0017094

(51) Int. Cl.
C30B 25/10      (2006.01)
C30B 25/18      (2006.01)
H01L 21/02      (2006.01)
C30B 29/40      (2006.01)

(52) U.S. Cl.
CPC .......... *C30B 25/186* (2013.01); *C30B 29/406* (2013.01); *H01L 21/0254* (2013.01); *H01L 21/02381* (2013.01); *H01L 21/02444* (2013.01); *H01L 21/02642* (2013.01)

(58) Field of Classification Search
CPC ................ C30B 25/186; C30B 29/406; H01L 21/92444; H01L 21/02642
See application file for complete search history.

(56) References Cited

PUBLICATIONS

Feng et al "Grouped and Multistep Nanoheteroeptixay: Toward High Quality GaN on Quasi-Periodic NanoMask", Applied Materials and Interfaces, pp. 18208-18214, 2016.*

* cited by examiner

*Primary Examiner* — Robert M Kunemund
(74) *Attorney, Agent, or Firm* — ScienBiziP, P.C.

(57) ABSTRACT

The disclosure relates to a method for making gallium nitride (GaN) epitaxial layer by silicon substrate is related. The method includes: providing a silicon substrate; providing a carbon nanotube structure comprising a plurality of carbon nanotubes and defining a plurality of holes; forming the carbon nanotube structure on a surface of the silicon substrate so that portions of the silicon substrate are exposed; dry etching the silicon substrate using the carbon nanotube structure as mask to obtain a patterned silicon substrate having a pattern surface comprising a plurality of bulges; and growing the GaN epitaxial layer using the patterned silicon substrate as an epitaxial substrate.

20 Claims, 27 Drawing Sheets

METHOD FOR MAKING GALLIUM NITRIDE EPITAXIAL LAYER BY SILICON SUBSTRATE

CROSS-REFERENCE TO RELATED APPLICATIONS

This application claims all benefits accruing under 35 U.S.C. § 119 from China Patent Application No. 201710017094.7, filed on Jan. 10, 2017, in the China Intellectual Property Office, the disclosure of which is incorporated herein by reference.

BACKGROUND

1. Technical Field

The present disclosure relates to a method for making gallium nitride (GaN) epitaxial layer by silicon substrate.

2. Description of Related Art

Light emitting devices such as light emitting diodes (LEDs) based on group III-V nitride semiconductors (e.g. GaN) have been put into practice.

Since wide GaN substrate cannot be produced, the LEDs have been produced on a heteroepitaxial substrate such as sapphire. The use of sapphire substrate is problematic due to lattice mismatch and thermal expansion mismatch between GaN and the sapphire substrate. One consequence of thermal expansion mismatch is bowing of the GaN/sapphire substrate structure, which leads to cracking and difficulty in fabricating devices with small feature sizes. A solution for this is to form a plurality of grooves on the surface of the sapphire substrate by lithography before growing the GaN layer. However, the process of lithography is complex, high in cost, and will pollute the sapphire substrate, specifically, the GaN epitaxial layer grown on the sapphire substrate is more preferred over the GaN epitaxial layer grown on the silicon substrate.

What is needed, therefore, is a method for making GaN epitaxial layer by silicon substrate that overcomes the problems as discussed above.

BRIEF DESCRIPTION OF THE DRAWINGS

Many aspects of the exemplary embodiments can be better understood with reference to the following drawings. The components in the drawings are not necessarily drawn to scale, the emphasis instead being placed upon clearly illustrating the principles of the exemplary embodiments. Moreover, in the drawings, like reference numerals designate corresponding portions throughout the several views.

DETAILED DESCRIPTION

Figure 1:
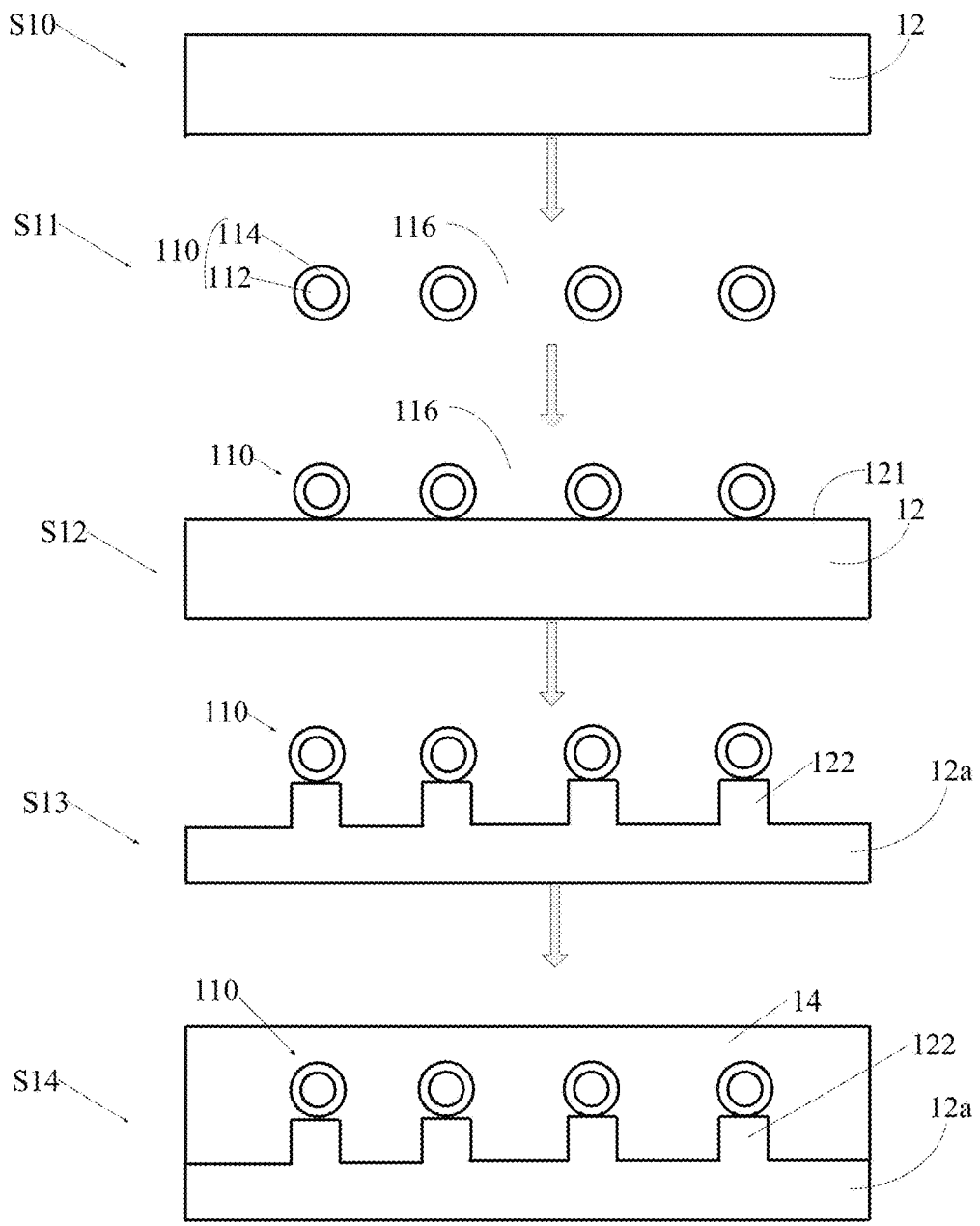
FIG. 1 is a flowchart of one exemplary embodiment of a method for making a GaN epitaxial layer by a silicon substrate.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale, and the proportions of certain portions may be exaggerated better illustrate details and features. The description is not to considered as limiting the scope of the exemplary embodiments described herein.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" exemplary embodiment in this disclosure are not necessarily to the same exemplary embodiment, and such references mean at least one.

References will now be made to the drawings to describe, in detail, various exemplary embodiments of the present methods for making GaN epitaxial layers on a silicon substrate.

Figure 13:
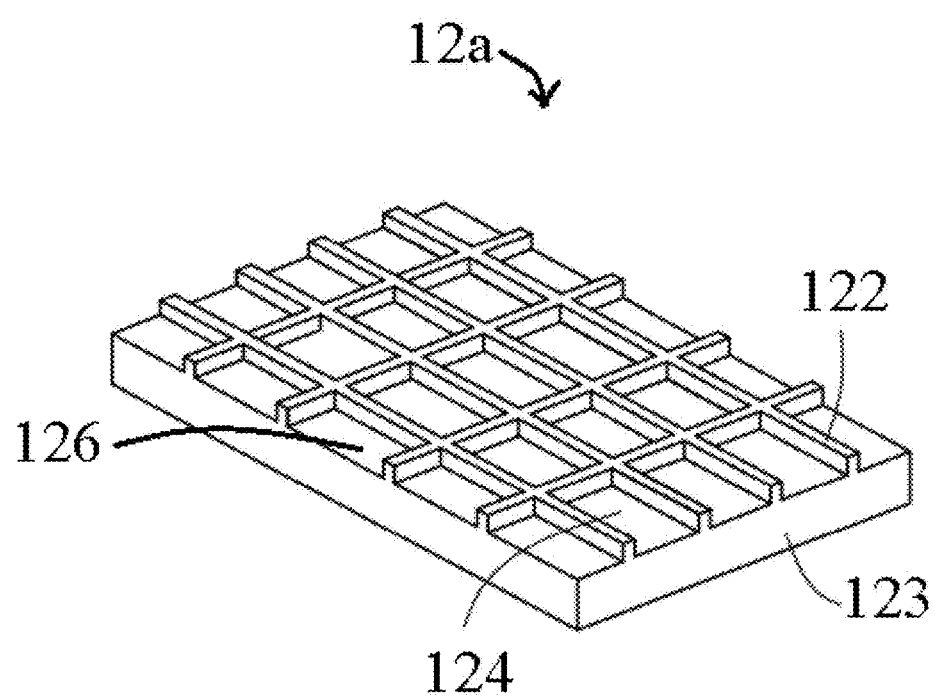
FIG. 13 is a schematic view of one exemplary embodiment of the patterned silicon substrate.

Referring to FIG. 1, a method for making a GaN epitaxial layer 14 on a silicon substrate 12 of one exemplary embodiment includes the following steps:

step (S10), providing the silicon substrate 12;

step (S11), providing a carbon nanotube composite structure 110, wherein the carbon nanotube composite structure 110 includes a carbon nanotube structure 112 and a protective layer 114 coated on the carbon nanotube structure 112; the carbon nanotube structure 112 includes a plurality of intersected carbon nanotubes and defines a plurality of openings 116;

step (S12), forming the carbon nanotube composite structure 110 on a surface 121 of the silicon substrate 12, wherein portions of the surface 121 are exposed from the plurality of openings 116;

step (S13), forming a patterned silicon substrate 12a having a bulged pattern 122 by dry etching the surface 121 using the carbon nanotube composite structure 110 as a mask, wherein the bulged pattern 122 includes a plurality of strip-shaped bulges intersected with each other as shown in FIG. 13; and step (S14), epitaxially growing a GaN epitaxial layer 14 on the patterned silicon substrate 12a.

In step (S10), the silicon substrate 12 is a single crystal silicon substrate. The silicon substrate 12 can be an intrinsic silicon substrate, a P-type doped silicon substrate, or a N-type doped silicon substrate. In one exemplary embodiment, the silicon substrate 12 is an intrinsic silicon wafer with a thickness of 300 micrometers.

In step (S11), the carbon nanotube structure 112 is a free-standing structure. The term "free-standing structure" includes that the carbon nanotube structure 112 can sustain the weight of itself when it is hoisted by a portion thereof without any significant damage to its structural integrity. Thus, the carbon nanotube structure 112 can be suspended by two spaced supports.

The plurality of carbon nanotubes can be single-walled carbon nanotubes, double-walled carbon nanotubes, or multi-walled carbon nanotubes. The length and diameter of the plurality of carbon nanotubes can be selected according to need. The diameter of the single-walled carbon nanotubes can be in a range from about 0.5 nanometers to about 10 nanometers. The diameter of the double-walled carbon nanotubes can be in a range from about 1.0 nanometer to about 15 nanometers. The diameter of the multi-walled carbon nanotubes can be in a range from about 1.5 nanometers to about 50 nanometers. In one exemplary embodiment, the length of the carbon nanotubes can be in a range from about 200 micrometers to about 900 micrometers.

The plurality of carbon nanotubes are orderly arranged to form an ordered carbon nanotube structure. The plurality of carbon nanotubes extend along a direction substantially parallel to the surface of the carbon nanotube structure 112. The term 'ordered carbon nanotube structure' includes, but is not limited to, a structure wherein the plurality of carbon nanotubes are arranged in a consistently systematic manner, e.g., the plurality of carbon nanotubes are arranged approximately along the same direction.

The carbon nanotube structure 112 defines a plurality of apertures. The aperture extends throughout the carbon nanotube structure 112 along the thickness direction thereof. The aperture can be a hole defined by several adjacent carbon nanotubes, or a gap defined by two substantially parallel carbon nanotubes and extending along axial direction of the carbon nanotubes. The hole shaped aperture and the gap shaped aperture can exist in the carbon nanotube structure 112 at the same time. Hereafter, the size of the aperture is the diameter of the hole or width of the gap. The sizes of the apertures can be different. The average size of the apertures can be in a range from about 10 nanometers to about 500 nanometers. For example, the sizes of the apertures can be about 50 nanometers, or 100 nanometers.

Figure 2:
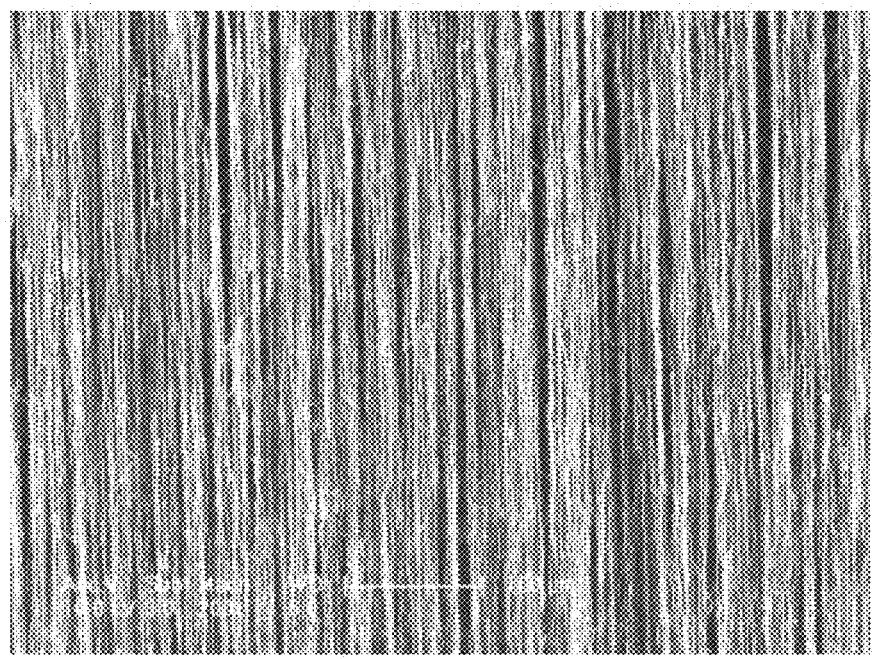
FIG. 2 is a Scanning Electron Microscope (SEM) image of one exemplary embodiment of a drawn carbon nanotube film.

In one exemplary embodiment, the carbon nanotube structure 112 includes a single drawn carbon nanotube film. The drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 2, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 2, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of apertures between adjacent carbon nanotubes.

The carbon nanotube structure 112 can include at least two stacked drawn carbon nanotube films. In other exemplary embodiments, the carbon nanotube structure 112 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in every two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure 112. In one exemplary embodiment, the carbon nanotube structure 112 has the aligned directions of the carbon nanotubes between adjacent stacked drawn carbon nanotube films at 90 degrees. Stacking the carbon nanotube films will also add to the structural integrity of the carbon nanotube structure 112.

The more the carbon nanotube films are stacked, the less apertures the carbon nanotube structure 112 has, and the less openings 116 the carbon nanotube composite structure 110 has. In one exemplary embodiment, the number of the stacked carbon nanotube films can be in a range from about 2 to about 4. When two carbon nanotube films are stacked, the angle between the aligned directions of the carbon nanotubes in the two drawn carbon nanotube films is about 90 degrees. When three carbon nanotube films are stacked, the angle between the aligned directions of the carbon nanotubes in every two adjacent drawn carbon nanotube films is about 60 degrees. When four carbon nanotube films are stacked, the angle between the aligned directions of the carbon nanotubes in every two adjacent drawn carbon nanotube films is about 45 degrees.

Figure 3:
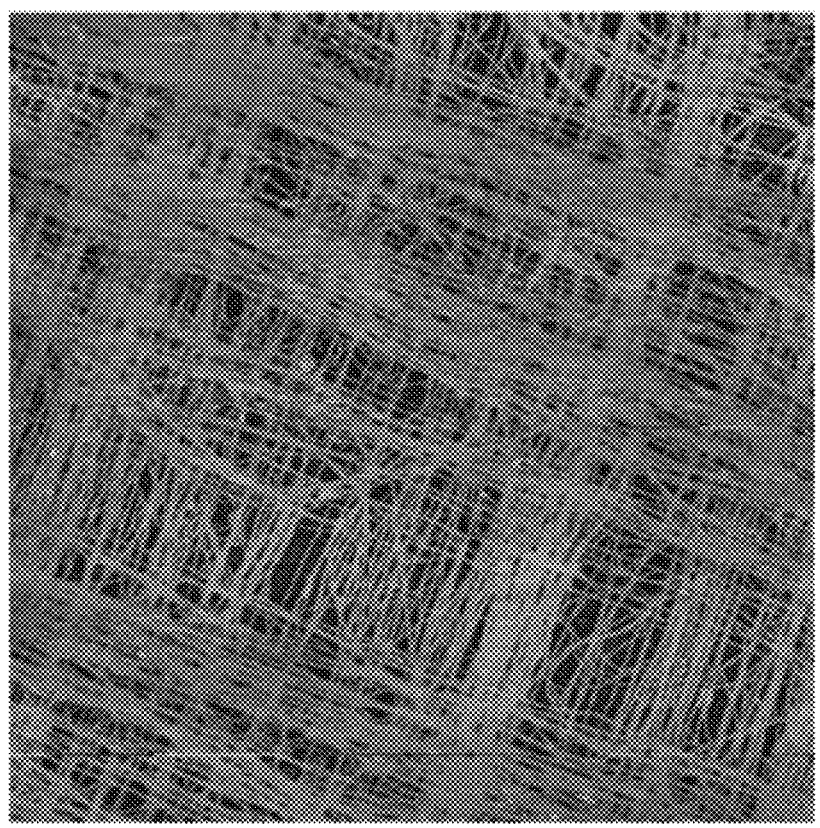
FIG. 3 is an SEM image of one exemplary embodiment of two cross-stacked drawn carbon nanotube films.
Figure 4:
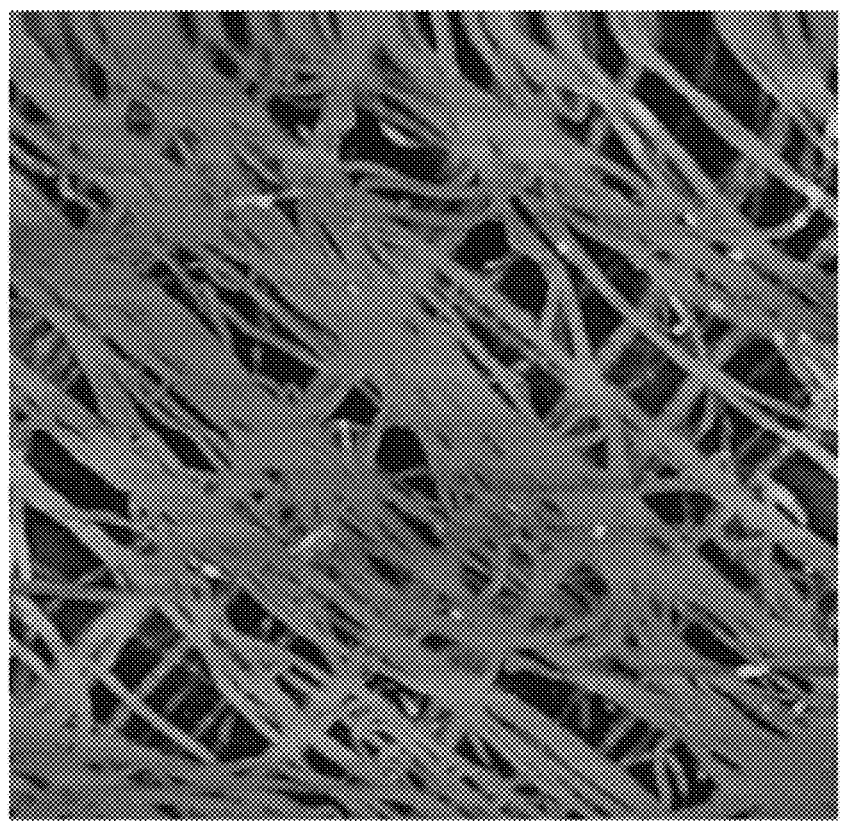
FIG. 4 is a partially enlarged image of the SEM image of FIG. 3.

As shown in FIGS. 3-4, in one exemplary embodiment, only two carbon nanotube films are stacked with each other, and aligned directions of the carbon nanotubes in the two drawn carbon nanotube films are substantially perpendicular with each other.

The carbon nanotube composite structure 110 can be made by applying a protective layer 114 on a surface of the carbon nanotube structure 112. The carbon nanotube structure 112 can be suspended in a depositing chamber during depositing the protective layer 114 so that two opposite surfaces of the carbon nanotube structure 112 are coated with the protective layer 114. In some exemplary embodiments, each of the plurality of carbon nanotubes is fully enclosed by the protective layer 114. In one exemplary embodiment, the carbon nanotube structure 112 is located on a frame so that the middle portion of the carbon nanotube structure 112 is suspended through the through hole of the frame. The frame can be any shape, such as a quadrilateral. The carbon nanotube structure 112 can also be suspended by a metal mesh or metal ring.

The method of depositing the protective layer 114 can be physical vapor deposition (PVD), chemical vapor deposition (CVD), atomic layer deposition (ALD), magnetron sputtering, or spraying.

The plurality of openings 116 are formed because of the plurality of apertures of the carbon nanotube structure 112. The plurality of openings 116 and the plurality of apertures have the same shape and different size. The size of the plurality of openings 116 is smaller than that of the plurality of apertures because the protective layer 114 is deposited in the plurality of apertures.

The thickness of the protective layer 114 is in a range from about 3 nanometers to about 50 nanometers. In one exemplary embodiment, the thickness of the protective layer 114 is in a range from about 3 nanometers to about 20 nanometers. If the thickness of the protective layer 114 is less than 3 nanometers, the protective layer 114 cannot prevent the carbon nanotubes from being destroyed in following etching process. If the thickness of the protective layer 114 is greater than 50 nanometers, the plurality of apertures may be fully filled by the protective layer 114 and the plurality of openings 116 cannot be obtained.

The material of the protective layer 114 can be metal, metal oxide, metal nitride, metal carbide, metal sulfide, silicon oxide, silicon nitride, or silicon carbide. The metal can be gold, nickel, titanium, iron, aluminum, titanium, chromium, or alloy thereof. The metal oxide can be alumina, magnesium oxide, zinc oxide, or hafnium oxide. The material of the protective layer 114 is not limited to the materials above and can be any material as long as the material can be deposited on the carbon nanotube structure 112, would not react with the carbon nanotubes and would not be etched easily in following drying etching process. The protective layer 114 is combined with the carbon nanotube structure 112 by van der Waals attractive force therebetween only.

Figure 5:
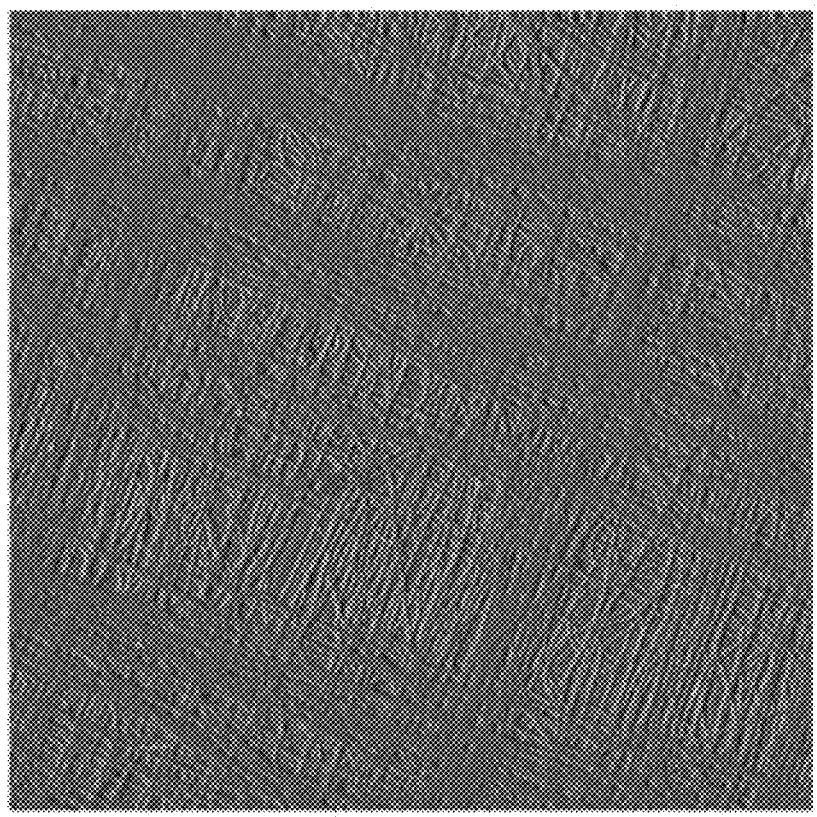
FIG. 5 is an SEM image of one exemplary embodiment of two cross-stacked drawn carbon nanotube composite films.
Figure 6:
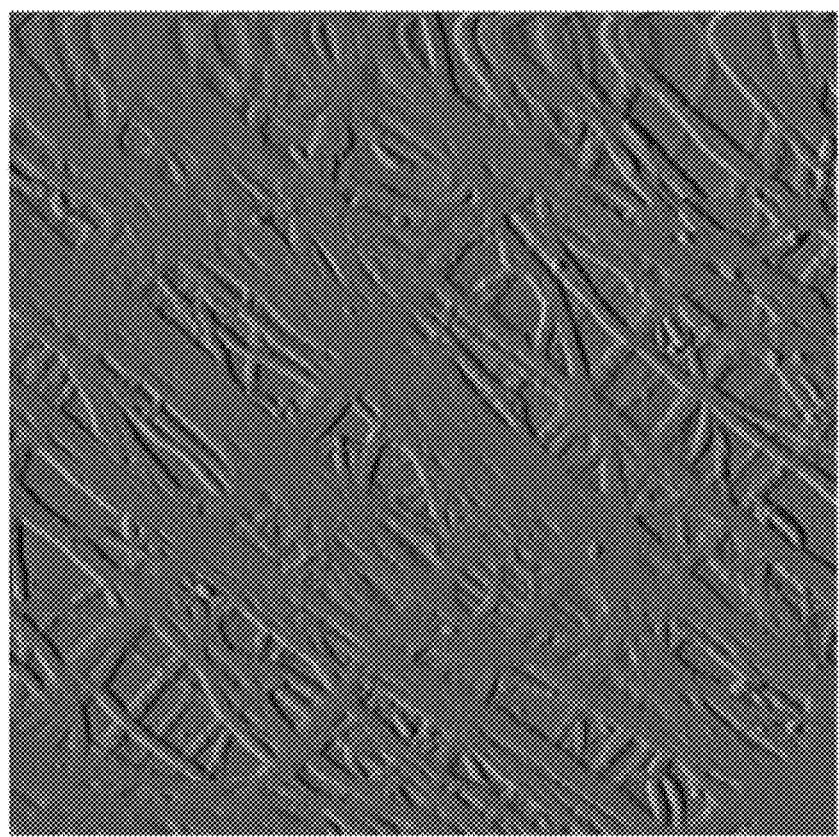
FIG. 6 is a partially enlarged image of the SEM image of FIG. 5.
Figure 7:
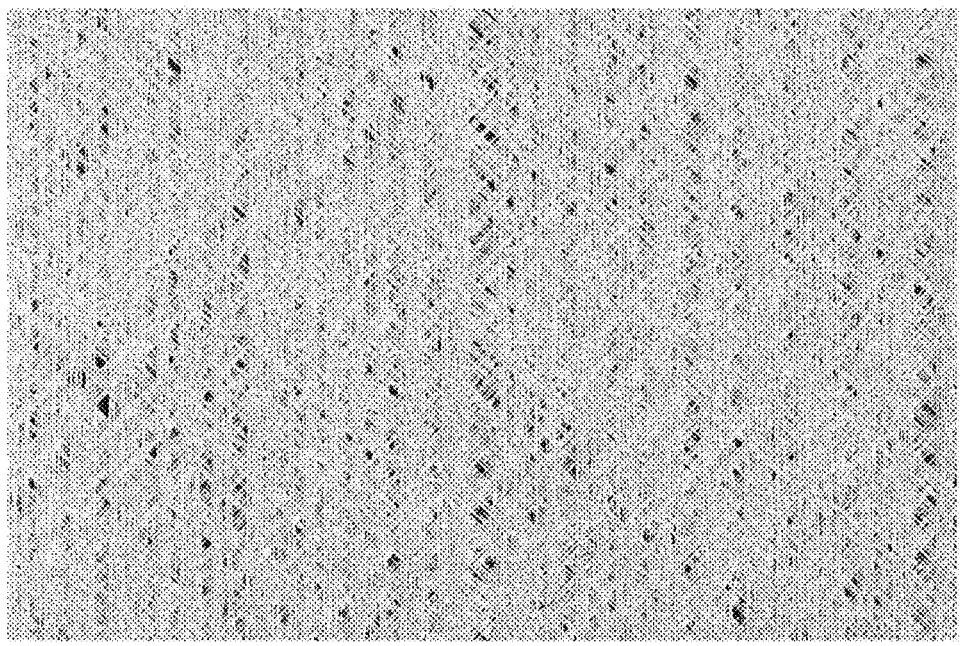
FIG. 7 is an SEM image of one exemplary embodiment of three cross-stacked drawn carbon nanotube composite films.
Figure 8:
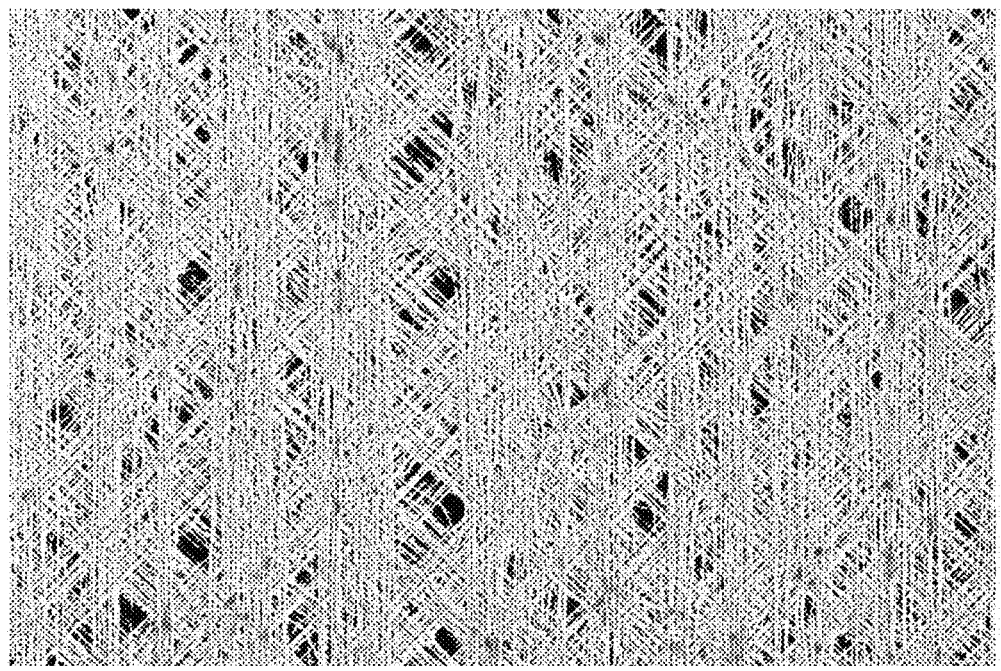
FIG. 8 is a partially enlarged image of the SEM image of FIG. 7.
Figure 9:
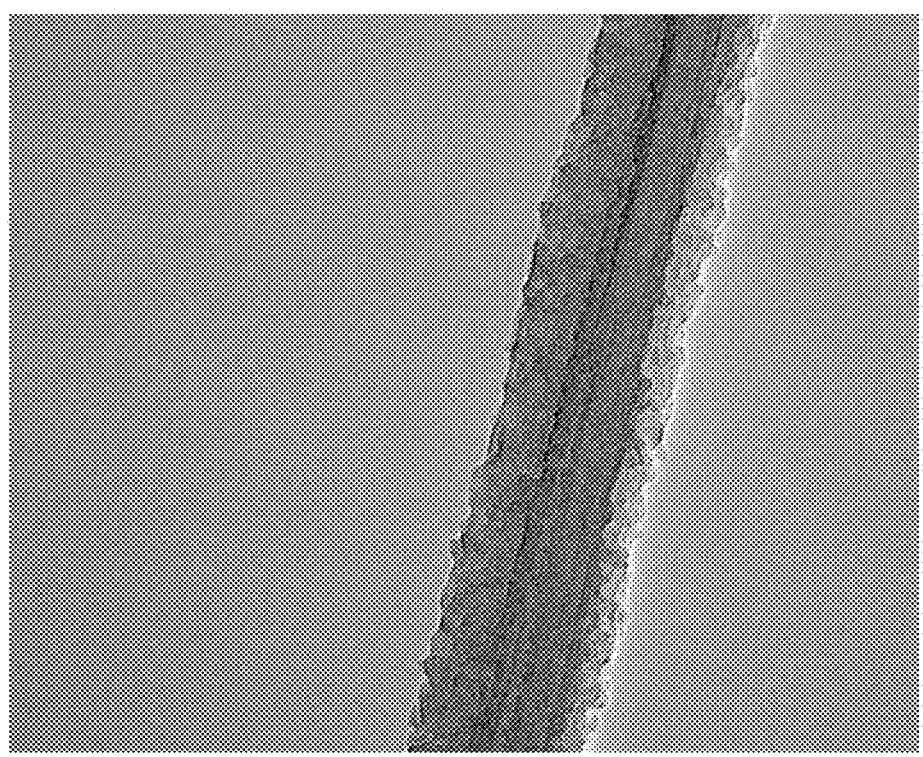
FIG. 9 is a SEM image of a single carbon nanotube coated with an alumina ($Al_2O_3$) layer.

As shown in FIGS. 5-6, in one exemplary embodiment, an alumina layer of 5 nanometers thickness is deposited on two stacked drawn carbon nanotube films by electron beam evaporation. The angle between the aligned directions of the carbon nanotubes between the two stacked drawn carbon nanotube films is 90 degrees. As shown in FIGS. 7-8, in one exemplary embodiment, an alumina layer of 10 nanometers thickness is deposited on three stacked drawn carbon nanotube films by electron beam evaporation. As shown in FIG. 9, each of the plurality of carbon nanotubes is entirely enclosed by the alumina layer.

In step (S12), the carbon nanotube composite structure 110 can be in direct contact with the surface 121 of the silicon substrate 12 or suspended above the surface 121 of the silicon substrate 12 by a support. In one exemplary embodiment, the carbon nanotube composite structure 110 is transferred on the surface 121 of the silicon substrate 12 through the frame.

In one exemplary embodiment, the formation of the carbon nanotube composite structure 110 on the surface 121 further comprises solvent treating the silicon substrate 12 with the carbon nanotube composite structure 110 thereon. Because there is air gap between the carbon nanotube composite structure 110 and the surface 121 of the silicon substrate 12, the solvent treatment can exhaust the air and allow the carbon nanotube composite structure 110 to be closely and firmly adhered on the surface 121 of the silicon substrate 12. The solvent treating can be applying a solvent to entire surface of the carbon nanotube composite structure 110 or immersing the entire silicon substrate 12 with the carbon nanotube composite structure 110 in a solvent. The solvent can be water or volatile organic solvent such as ethanol, methanol, acetone, dichloroethane, chloroform, or mixtures thereof. In one exemplary embodiment, the organic solvent is ethanol.

In the step (S13), the dry etching can be plasma etching or reactive ion etching (ME). In one exemplary embodiment, the dry etching is performed by applying plasma energy on the entire or partial surface of the surface 121 via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

In one exemplary embodiment, the plasma gas is a mixture of chlorine and argon. The power of the plasma device can be in a range from about 20 watts to about 70 watts. The plasma flow of chlorine can be in a range from about 5 sccm to about 20 sccm, such as 10 sccm. The plasma flow of argon can be in a range from about 15 sccm to about 40 sccm, such as 25 sccm. When the plasma is produced in vacuum, the work pressure of the plasma can be in a range from about 3 Pa to 10 Pa, such as 6 Pa. The time for plasma etching can be in a range from about 10 seconds to about 60 seconds, such as 45 seconds.

In the etching process, the etching gas reacts with the silicon substrate 12, but does not react with the protective layer 114 or react with the protective layer 114 at a speed much less than that of the reaction between the etching gas and the silicon substrate 12. Thus, the exposed portion of the silicon substrate 12 would be etched gradually and the portion of the silicon substrate 12 that are shielded by the carbon nanotube composite structure 110 would not be etched.

Figure 10:
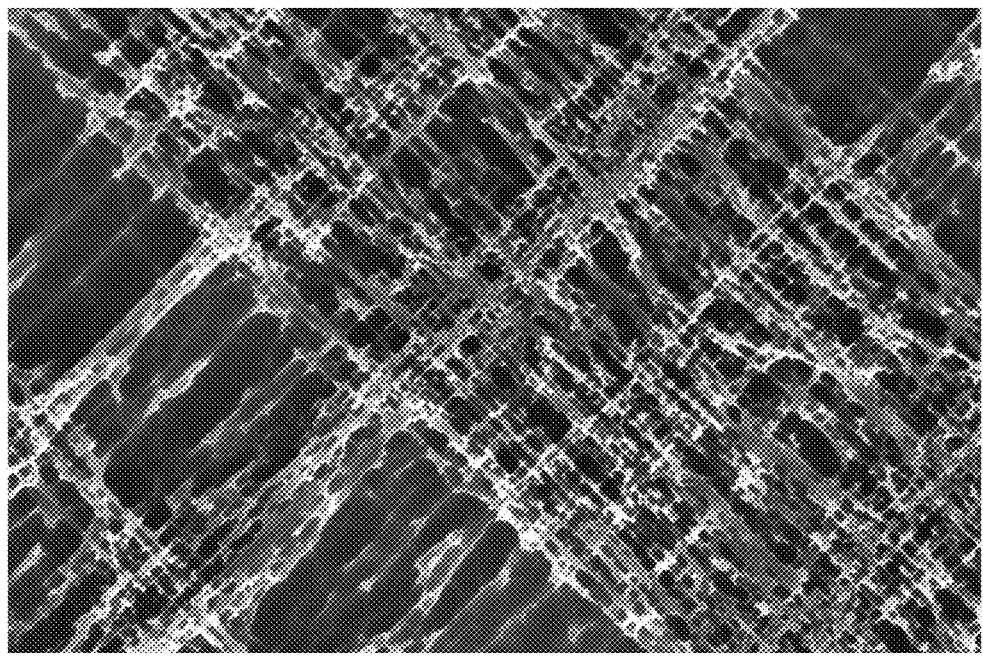
FIG. 10 is a SEM image of one exemplary embodiment of a patterned silicon substrate viewed from above.
Figure 11:
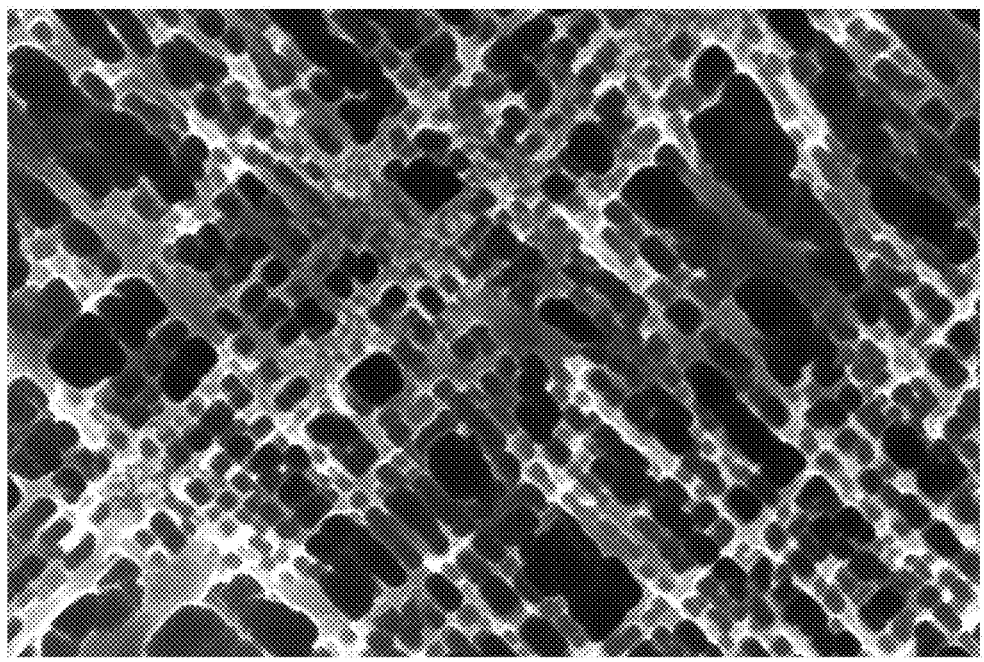
FIG. 11 is a partially enlarged image of the SEM image of FIG. 10.
Figure 12:
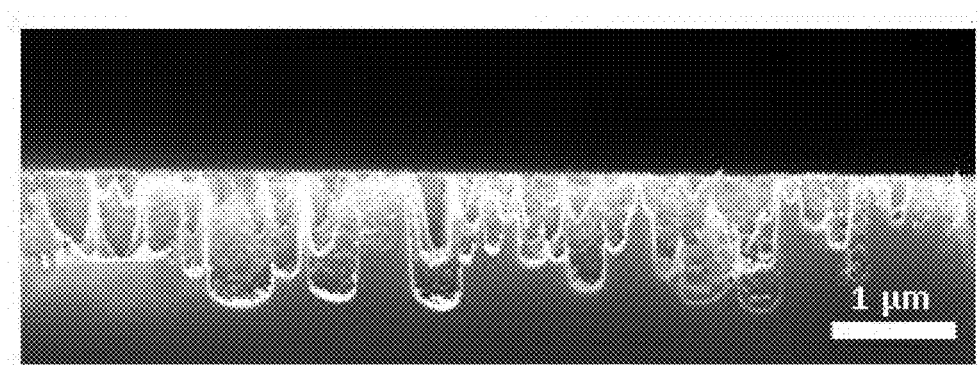
FIG. 12 is a SEM image of one exemplary embodiment of a cross-section of the patterned silicon substrate.

The bulged pattern 122 and the carbon nanotube composite structure 110 substantially have the same pattern. When the carbon nanotube structure 112 includes a plurality of intersected drawn carbon nanotube films, the bulged pattern 122 includes a plurality of strip-shaped bulges intersected with each other to form a net structure as shown in FIGS. 10-13. FIGS. 10-11 show a SEM image of one exemplary embodiment of a patterned silicon substrate viewed from above. FIG. 12 is a SEM image of one exemplary embodiment of a cross-section of the patterned silicon substrate.

Referring to FIG. 13, the patterned silicon substrate 12a comprises a base 123 and a bulged pattern 122 located on a surface of the base 123. The bulged pattern 122 comprises a plurality of strip-shaped bulges intersected with each other to form a net structure and defines a plurality of holes 124. The bottom surfaces of the plurality of holes 124 are defined as an epitaxial growth surface 126.

Each of the plurality of strip-shaped bulges has a length less than or equal to the width of length of the base 123. The plurality of strip-shaped bulges comprises a plurality of first strip-shaped bulges and a plurality of second strip-shaped bulges. The plurality of first strip-shaped bulges are substantially parallel with each other and extends along the first direction, and the plurality of second strip-shaped bulges are substantially parallel with each other and extends along the second direction that is different from the first direction. The angle between the first direction and the second direction is greater than 0 degrees and less than or equal to 90 degrees. In one exemplary embodiment, the angle between the first direction and the second direction is greater than 30 degrees.

The width of the plurality of strip-shaped bulges can be in a range from about 20 nanometers to about 150 nanometers. In one exemplary embodiment, the width of the plurality of strip-shaped bulges can be in a range from about 20 nanometers to about 100 nanometers. In one exemplary embodiment, the width of the plurality of strip-shaped bulges can be in a range from about 20 nanometers to about 50 nanometers. The distance between every two adjacent of the plurality of strip-shaped bulges can be in a range from about 10 nanometers to about 300 nanometers. In one exemplary embodiment, the distance between every two adjacent of the plurality of strip-shaped bulges can be in a range from about 10 nanometers to about 100 nanometers. In one exemplary embodiment, the distance between every two adjacent of the plurality of strip-shaped bulges can be in a range from about 10 nanometers to about 50 nanometers. The height of the plurality of strip-shaped bulges can be in a range from about 50 nanometers to about 1000 nanometers. In one exemplary embodiment, the height of the plurality of strip-shaped bulges can be in a range from about 500 nanometers to about 1000 nanometers. The average diameter of the plurality of holes 124 can be in a range from about 10 nanometers to about 300 nanometers, and the depth of the plurality of holes 124 can be in a range from about 50 nanometers to about 1000 nanometers. In one exemplary embodiment, the ratio between the depth and the average diameter is greater than 5. In one exemplary embodiment, the ratio between the depth and the average diameter is greater than 10.

After coating with the protective layer 114, the diameter of the carbon nanotubes are about tens of nanometers, and distance between every two adjacent carbon nanotubes are about tens of nanometers. Thus, the width and distance of the plurality of strip-shaped bulges are also tens of nanometers, and the average diameter of the plurality of holes 124 are also tens of nanometers. The density of the strip-shaped bulges and the holes 124 would be increased. For example, when both the width and distance of the plurality of strip-shaped bulges are 20 nanometers, the number of the strip-shaped bulges and the holes 124 would be 50 within 1 micrometer. The conventional photolithography method cannot make all the strip-shaped bulges in nanoscale and obtain this density due to the resolution limitation.

In step (S14), the GaN epitaxial layer 14 can be grown by a method such as molecular beam epitaxy, chemical beam epitaxy, reduced pressure epitaxy, low temperature epitaxy, select epitaxy, liquid phase deposition epitaxy, metal organic vapor phase epitaxy, ultra-high vacuum chemical vapor deposition, hydride vapor phase epitaxy, or metal organic chemical vapor deposition (MOCVD).

The GaN epitaxial layer 14 is a single crystal layer. The thickness of the GaN epitaxial layer 14 can be prepared according to need. The thickness of the GaN epitaxial layer 14 can be in a range from about 100 nanometers to about 500 micrometers. For example, the thickness of the GaN epitaxial layer 14 can be about 200 nanometers, 500 nanometers, 1 micrometer, 2 micrometers, 5 micrometers, 10 micrometers, or 50 micrometers.

Figure 14:
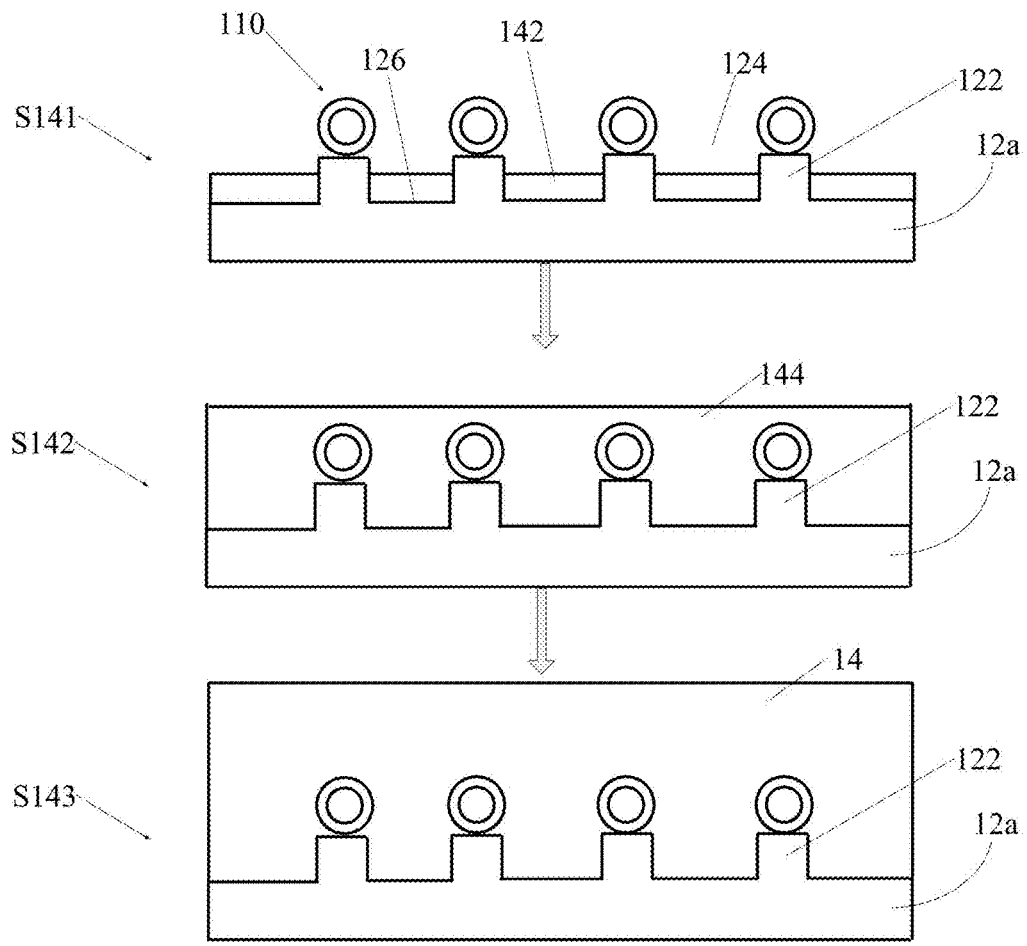
FIG. 14 is a flowchart of one exemplary embodiment of a process of growing a GaN epitaxial layer on the patterned silicon substrate.

Referring to FIG. 14, step (S14) includes the following substeps:

step (141), nucleating on the epitaxial growth surface 126 and growing a plurality of epitaxial crystal grains 142 along the direction substantially perpendicular to the epitaxial growth surface 126;

step (142), forming a continuous epitaxial film 144 by making the epitaxial crystal grains 142 grow along the direction substantially parallel to the epitaxial growth surface 126; and step (143), forming the GaN epitaxial layer 14 by making the epitaxial film 144 grow along the direction substantially perpendicular to the epitaxial growth surface 126.

In step (S141), the epitaxial crystal grains 142 cannot grow from the top surface of the bulged pattern 122 because of the baffle of the carbon nanotube composite structure 110. The epitaxial crystal grains 142 may grow also from the side surface of the plurality of holes 124.

In one exemplary embodiment, the GaN epitaxial layer 14 is grown on the patterned silicon substrate 12a by MOCVD method. The nitrogen source gas is high-purity ammonia ($NH_3$), the Ga source gas is trimethyl gallium (TMGa) or triethyl gallium (TEGa), and the carrier gas is hydrogen ($H_2$). The patterned silicon substrate 12a is placed in a vacuum reaction chamber, and the vacuum reaction chamber is heated to a temperature of about 1100° C. to about 1200° C. The hydrogen gas is introduced in the vacuum reaction chamber, and the reaction chamber is kept at the temperature of about 1100° C. to about 1200° C. for about 200 seconds to about 1000 seconds. The reaction chamber is cooled down to a temperature of about 500° C. to about 650° C., and the nitrogen source gas and the Ga source gas are introduced in the vacuum reaction chamber to grow a buffer layer with a thickness of 10 nanometers to about 50 nanometers. Ga source gas is no longer introduced, however, the nitrogen source gas continues to input, and the reaction chamber is heated to the temperature of about 1100° C. to about 1200° C. again and kept at the temperature of about 1100° C. to about 1200° C. for about 30 seconds to about 300 seconds. Keep introducing the nitrogen source gas, and the nitrogen source gas is introduced in the vacuum reaction chamber again to grow the GaN epitaxial layer 14.

The GaN epitaxial layer 124 grown on the patterned silicon substrate 12a is as good as the GaN epitaxial layer grown on the sapphire substrate.

Figure 15:
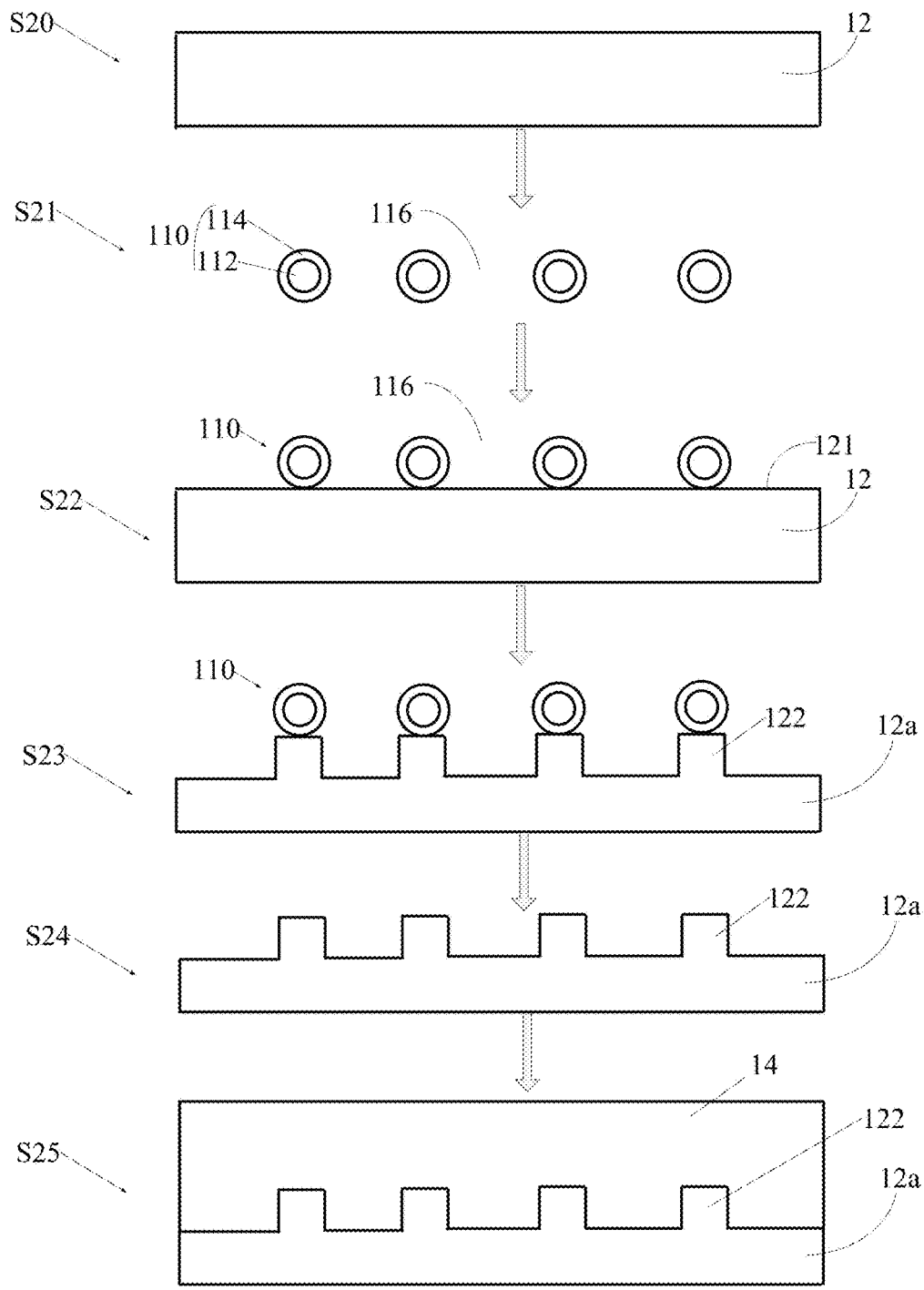
FIG. 15 is a flowchart of another exemplary embodiment of the method for making a GaN epitaxial layer by a silicon substrate.

Referring to FIG. 15, a method for making a GaN epitaxial layer 14 on a silicon substrate 12 of one exemplary embodiment includes the following steps:

step (S20), providing the silicon substrate 12;

step (S21), providing a carbon nanotube composite structure 110, wherein the carbon nanotube composite structure 110 includes a carbon nanotube structure 112 and a protective layer 114 coated on the carbon nanotube structure 112, and the carbon nanotube structure 112 includes a plurality of intersected carbon nanotubes and defines a plurality of openings 116;

step (S22), forming the carbon nanotube composite structure 110 on a surface 121 of the silicon substrate 12, wherein portions of the surface 121 are exposed from the plurality of openings 116;

step (S23), forming a patterned silicon substrate 12a having a bulged pattern 122 by dry etching the surface 121 using the carbon nanotube composite structure 110 as a mask, wherein the bulged pattern 122 includes a plurality of strip-shaped bulges intersected with each other;

step (S24), removing the carbon nanotube composite structure 110 from the patterned silicon substrate 12a; and step (S25), epitaxially growing a GaN epitaxial layer 14 on the patterned silicon substrate 12a.

The method of FIG. 15 is similar to the method of FIG. 1 except that the carbon nanotube composite structure 110 is removed from the patterned silicon substrate 12a before epitaxially growing the GaN epitaxial layer 14.

Figure 16:
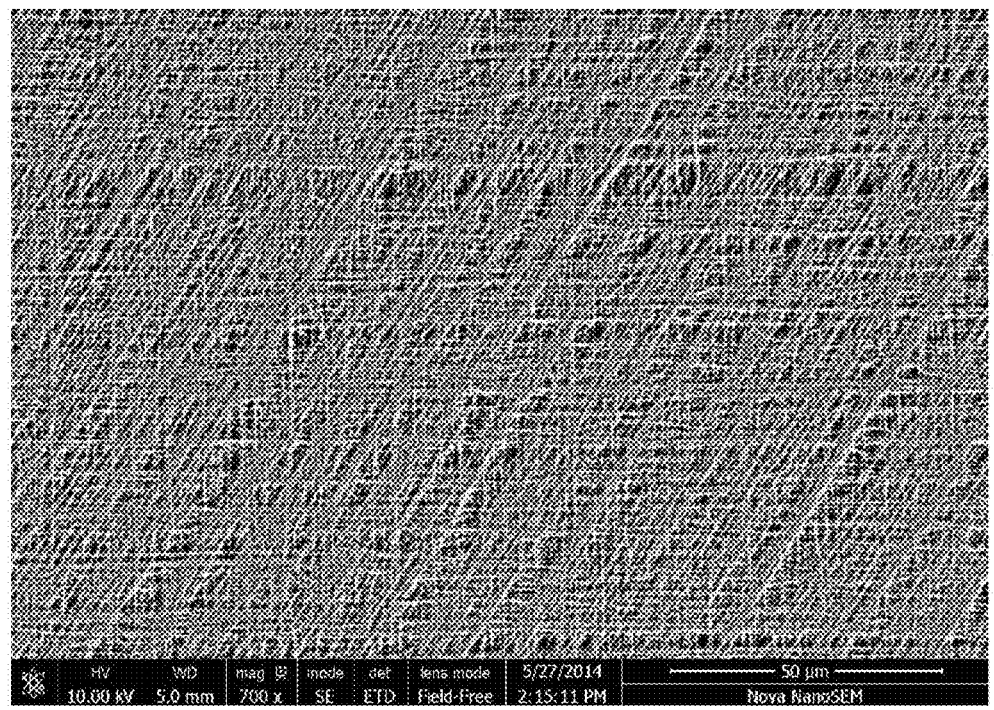
FIG. 16 is a SEM image of one exemplary embodiment of a patterned silicon substrate viewed from above.
Figure 17:
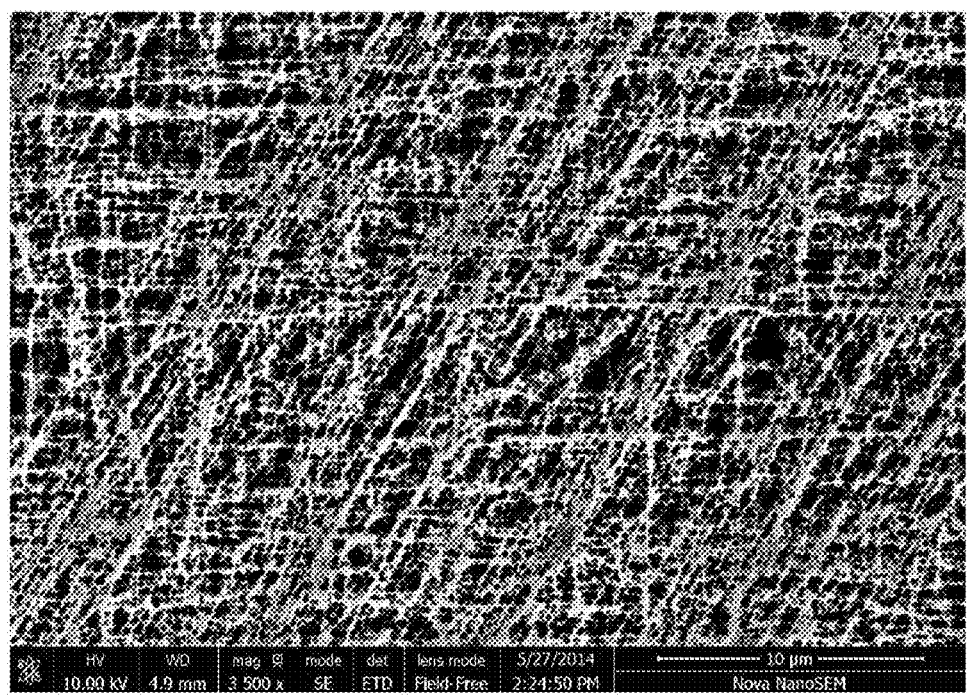
FIG. 17 is a partially enlarged image of the SEM image of FIG. 16.
Figure 18:
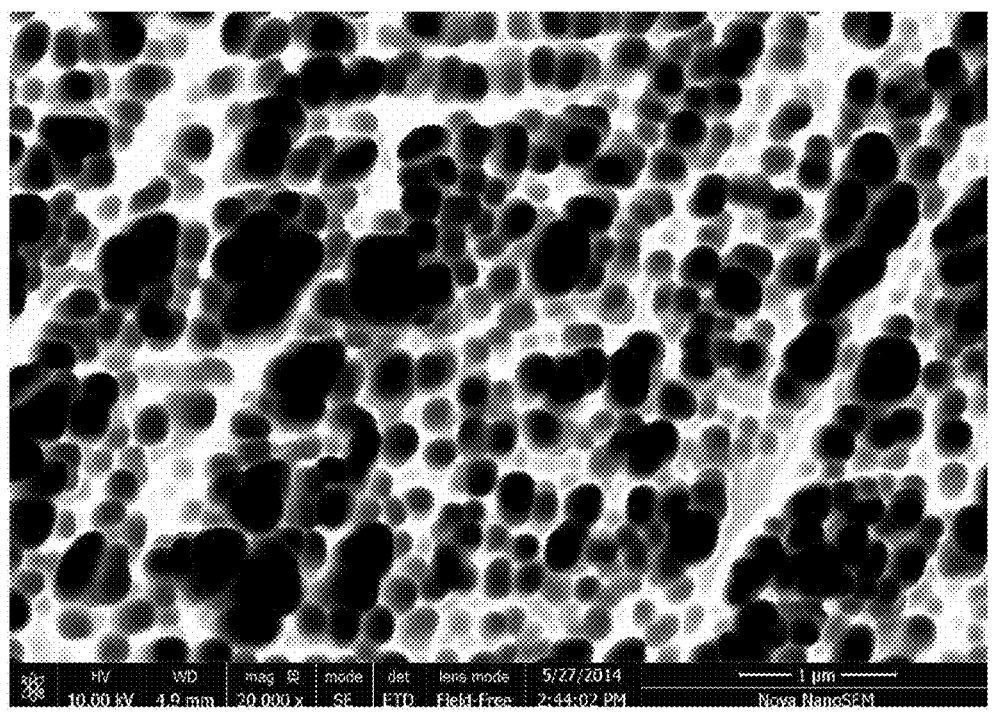
FIG. 18 is a partially enlarged image of the SEM image of FIG. 17.

In step (S23), the patterned silicon substrate 12a is formed and observed by SEM. The SEM images are shown in FIGS. 16-18.

Figure 19:
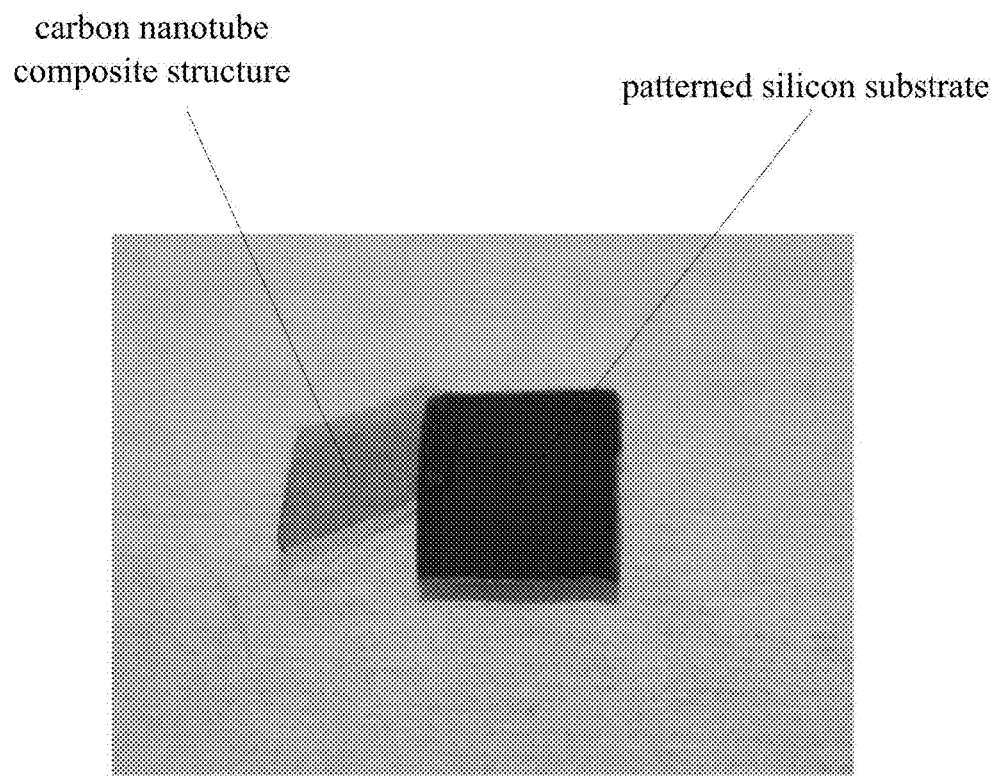
FIG. 19 shows that the carbon nanotube composite structure is entirely removed from the patterned silicon substrate by blowing.

In step (S24), the method of removing the carbon nanotube composite structure 110 can be ultrasonic method, or adhesive tape peeling, oxidation. In one exemplary embodiment, the patterned silicon substrate 12a with the carbon nanotube composite structure 110 thereon is placed in an N-methyl pyrrolidone solution and ultrasonic treating for several minutes. In another one exemplary embodiment, the carbon nanotube composite structure is entirely removed from the patterned silicon substrate by blowing as shown in FIG. 19 because the carbon nanotube composite structure is still a free standing structure after dry etching.

In step (S25), the epitaxial crystal grains 142 are simultaneously grown from both the top surface of the bulged pattern 122 and the bottom surface of the plurality of holes 124 along the direction substantially perpendicular to the epitaxial growth surface 126. The epitaxial crystal grains 142 grows along the direction substantially parallel to the epitaxial growth surface 126 to form the epitaxial film 144. The epitaxial film 144 grows along the direction substantially perpendicular to the epitaxial growth surface 126 to form the GaN epitaxial layer 14.

Figure 20:
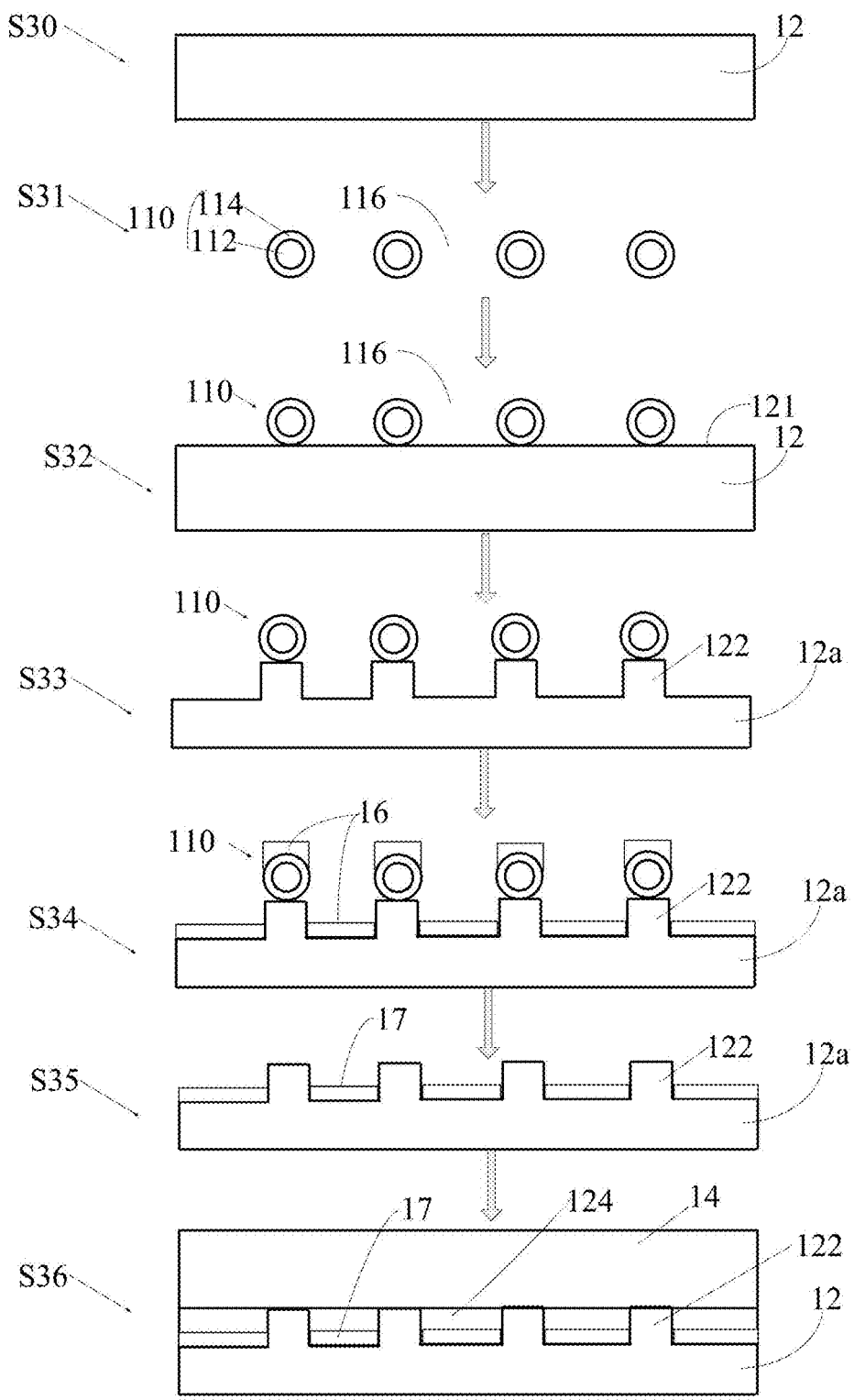
FIG. 20 is a flowchart of another exemplary embodiment of the method for making a GaN epitaxial layer by a silicon substrate.
Figure 21:
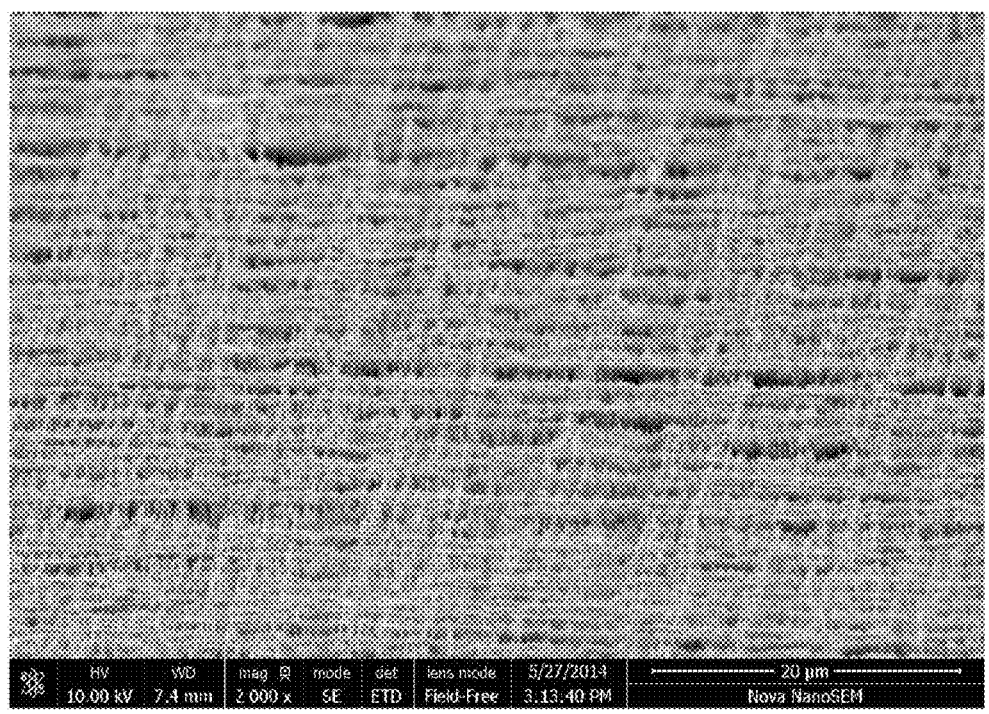
FIG. 21 is a SEM image of one exemplary embodiment of a patterned silicon substrate viewed from above.
Figure 22:
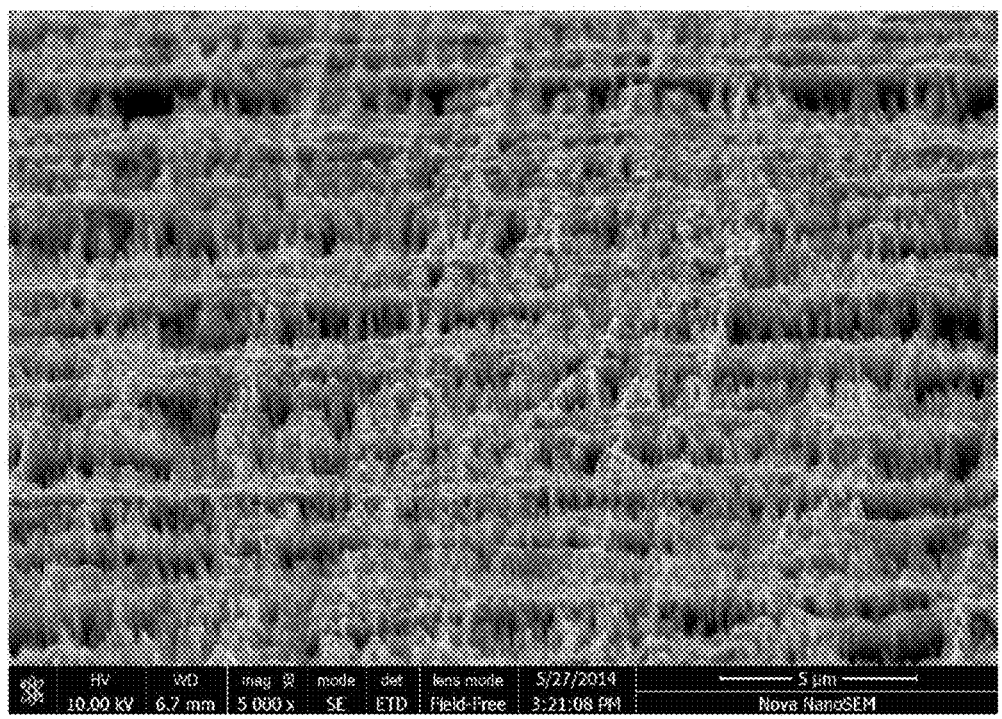
FIG. 22 is a partially enlarged image of the SEM image of FIG. 20.
Figure 23:
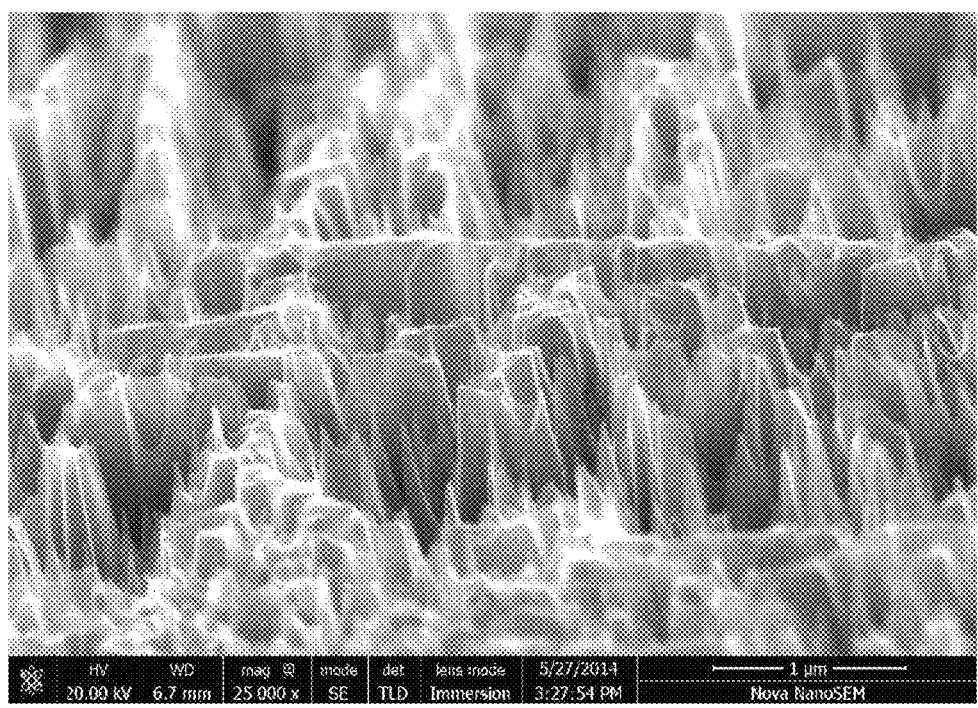
FIG. 23 is a partially enlarged image of the SEM image of FIG. 21.
Figure 24:
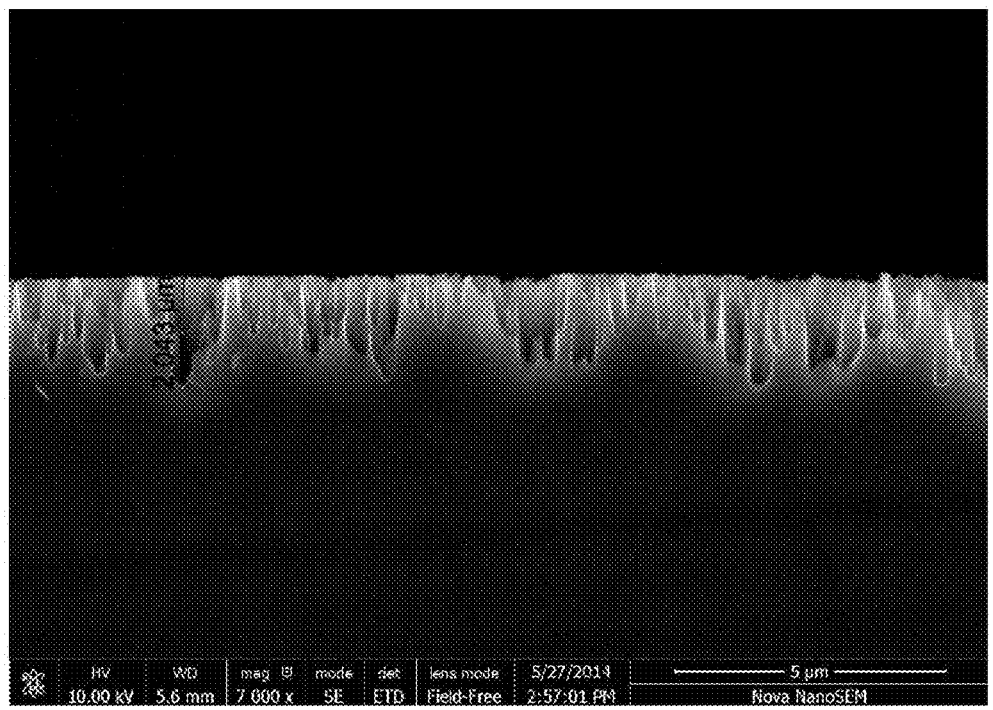
FIG. 24 is a SEM image of one exemplary embodiment of a cross-section of the patterned silicon substrate.

Referring to FIG. 20, a method for making a GaN epitaxial layer 14 on a silicon substrate 12 of one exemplary embodiment includes the following steps:

step (S30), providing the silicon substrate 12;

step (S31), providing a carbon nanotube composite structure 110, wherein the carbon nanotube composite structure 110 includes a carbon nanotube structure 112 and a protective layer 114 coated on the carbon nanotube structure 112, and the carbon nanotube structure 112 includes a plurality of intersected carbon nanotubes and defines a plurality of openings 116;

step (S32), forming the carbon nanotube composite structure 110 on a surface 121 of the silicon substrate 12, wherein portions of the surface 121 are exposed from the plurality of openings 116;

step (S33), forming a patterned silicon substrate 12a having a bulged pattern 122 by dry etching the surface 121 using the carbon nanotube composite structure 110 as a mask, wherein the bulged pattern 122 includes a plurality of strip-shaped bulges intersected with each other;

step (S34), depositing a baffle layer 16 to cover both the carbon nanotube composite structure 110 and the bulged pattern 122;

step (S35), obtaining a patterned baffle layer 17 by removing the carbon nanotube composite structure 110 from the patterned silicon substrate 12a; and step (S36), epitaxially growing a GaN epitaxial layer 14 on the patterned silicon substrate 12a.

The method of FIG. 20 is similar to the method of FIG. 15 except that the baffle layer 16 is deposited on the patterned silicon substrate 12a to cover both the carbon nanotube composite structure 110 and the bulged pattern 122.

In step (S33), the patterned silicon substrate 12a is formed and observed by SEM. The SEM images are shown in FIGS. 21-24.

In step (S34), the baffle layer 16 can be deposited by electron beam evaporation, ion beam sputtering, atomic layer deposition, magnetron sputtering, thermal vapor deposition, or chemical vapor deposition. A first portion of the baffle layer 16 is deposited on the surface of the carbon nanotube composite structure 110, and a second portion of the baffle layer 16 is deposited on the bottom surface of the plurality of holes 124. The thickness of the baffle layer 16 is less than the depth of the holes 124 so the first portion of the baffle layer 16 and the second portion of the baffle layer 16 are spaced from each other to form a discontinuous structure. Thus, the first portion of the baffle layer 16 would be removed from the patterned silicon substrate 12a together with the carbon nanotube composite structure 110. The second portion of the baffle layer 16 would be remained on the bottom surface of the plurality of holes 124 to form the patterned baffle layer 17. The material of the baffle layer 16 can be any material not able to be used to grow the GaN epitaxial layer 14. The material of the baffle layer 16 can be silicon dioxide ($SiO_2$) or silicon nitride ($Si_3N_4$).

In step (S36), the epitaxial crystal grains 142 are vertically grown from the top surface of the bulged pattern 122, and cannot grow from the bottom surface of the plurality of holes 124 because the baffle of the patterned baffle layer 17. The epitaxial crystal grains 142 then laterally grows along the direction substantially parallel to the epitaxial growth surface 126 to form the epitaxial film 144. The epitaxial film 144 grows along the direction substantially perpendicular to the epitaxial growth surface 126 to form the GaN epitaxial layer 14. The plurality of holes 124 are not filled by the GaN epitaxial layer 14, and a hollow space is formed between the patterned baffle layer 17 and the GaN epitaxial layer 14. Thus, the mismatch between the GaN epitaxial layer 14 and the patterned silicon substrate 12a would be further reduced.

Figure 25:
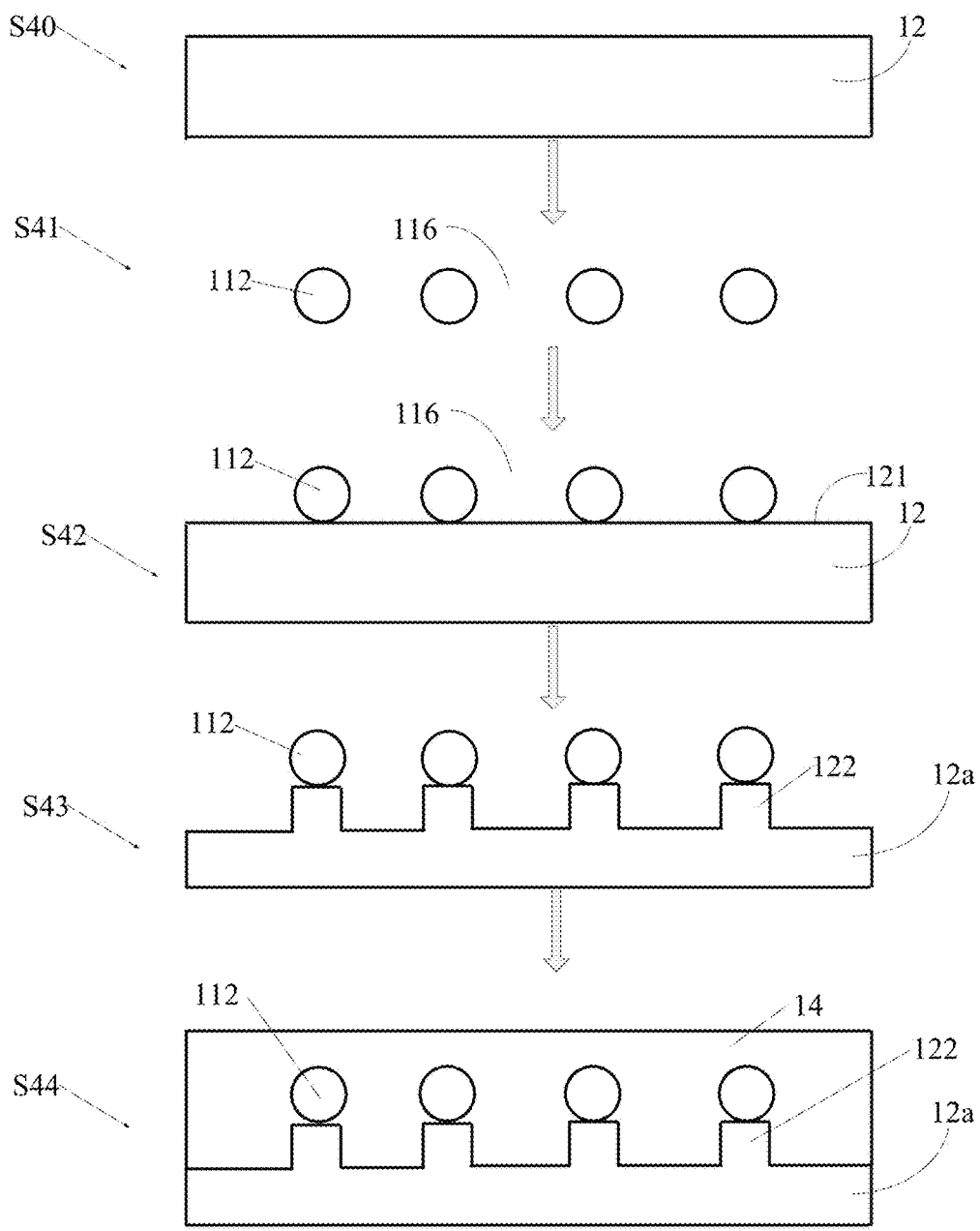
FIG. 25 is a flowchart of another exemplary embodiment of the method for making a GaN epitaxial layer by a silicon substrate.

Referring to FIG. 25, a method for making a GaN epitaxial layer 14 on a silicon substrate 12 of one exemplary embodiment includes the following steps:

step (S40), providing the silicon substrate 12;

step (S41), providing a carbon nanotube structure 112, wherein the carbon nanotube structure 112 includes a plurality of intersected carbon nanotubes and defines a plurality of openings 116;

step (S42), forming the carbon nanotube structure 112 on a surface 121 of the silicon substrate 12, wherein portions of the surface 121 are exposed from the plurality of openings 116;

step (S43), forming a patterned silicon substrate 12a having a bulged pattern 122 by dry etching the surface 121 using the carbon nanotube structure 112 as a mask, wherein the bulged pattern 122 includes a plurality of strip-shaped bulges intersected with each other;

step (S44), epitaxially growing a GaN epitaxial layer 14 on the patterned silicon substrate 12a.

The method of FIG. 25 is similar to the method of FIG. 1 except that the carbon nanotube structure 112 only including the plurality of intersected carbon nanotubes is used as the mask for dry etching.

Figure 26:
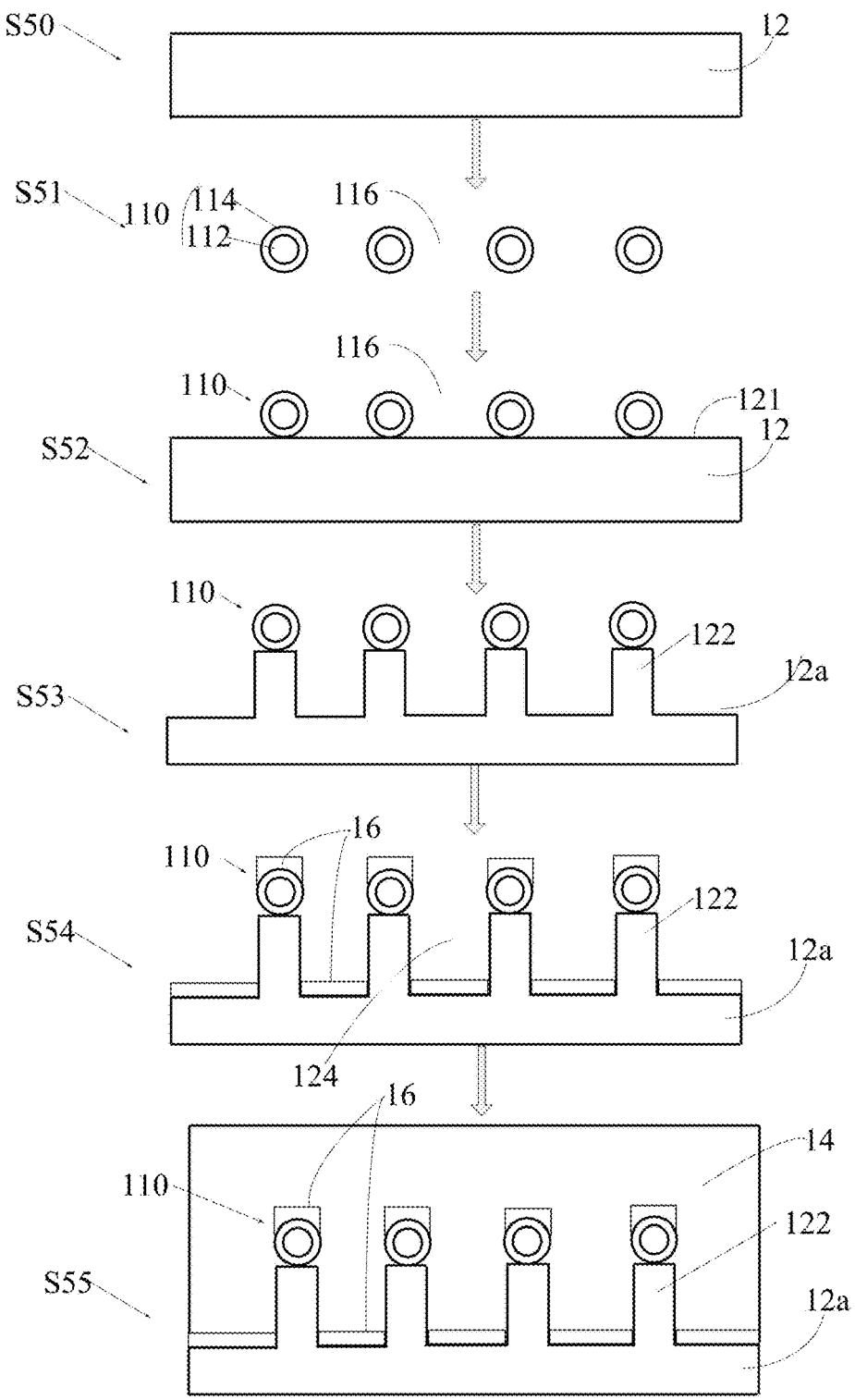
FIG. 26 is a flowchart of another exemplary embodiment of the method for making a GaN epitaxial layer by a silicon substrate.

Referring to FIG. 26, a method for making a GaN epitaxial layer 14 on a silicon substrate 12 of one exemplary embodiment includes the following steps:

step (S50), providing the silicon substrate 12;

step (S51), providing a carbon nanotube composite structure 110, wherein the carbon nanotube composite structure 110 includes a carbon nanotube structure 112 and a protective layer 114 coated on the carbon nanotube structure 112, and the carbon nanotube structure 112 includes a plurality of intersected carbon nanotubes and defines a plurality of openings 116;

step (S52), forming the carbon nanotube composite structure 110 on a surface 121 of the silicon substrate 12, wherein portions of the surface 121 are exposed from the plurality of openings 116;

step (S53), forming a patterned silicon substrate 12a having a bulged pattern 122 by dry etching the surface 121 using the carbon nanotube composite structure 110 as a mask, wherein the bulged pattern 122 includes a plurality of strip-shaped bulges intersected with each other;

step (S54), depositing a baffle layer 16 to cover both the carbon nanotube composite structure 110 and the bulged pattern 122, wherein the baffle layer 16 is deposited on the surface of the carbon nanotube composite structure 110 and the bottom surface of the plurality of holes 124 so that portions of the side surface of the bulged pattern 122 is exposed; and step (S55), epitaxially growing a GaN epitaxial layer 14 on the patterned silicon substrate 12a.

The method of FIG. 26 is similar to the method of FIG. 20 except that the carbon nanotube composite structure 110 is kept on the bulged pattern 122 during epitaxially growing the GaN epitaxial layer 14 so that the GaN epitaxial layer 14 the carbon nanotube composite structure 110 is enclosed by the GaN epitaxial layer 14.

Figure 27:
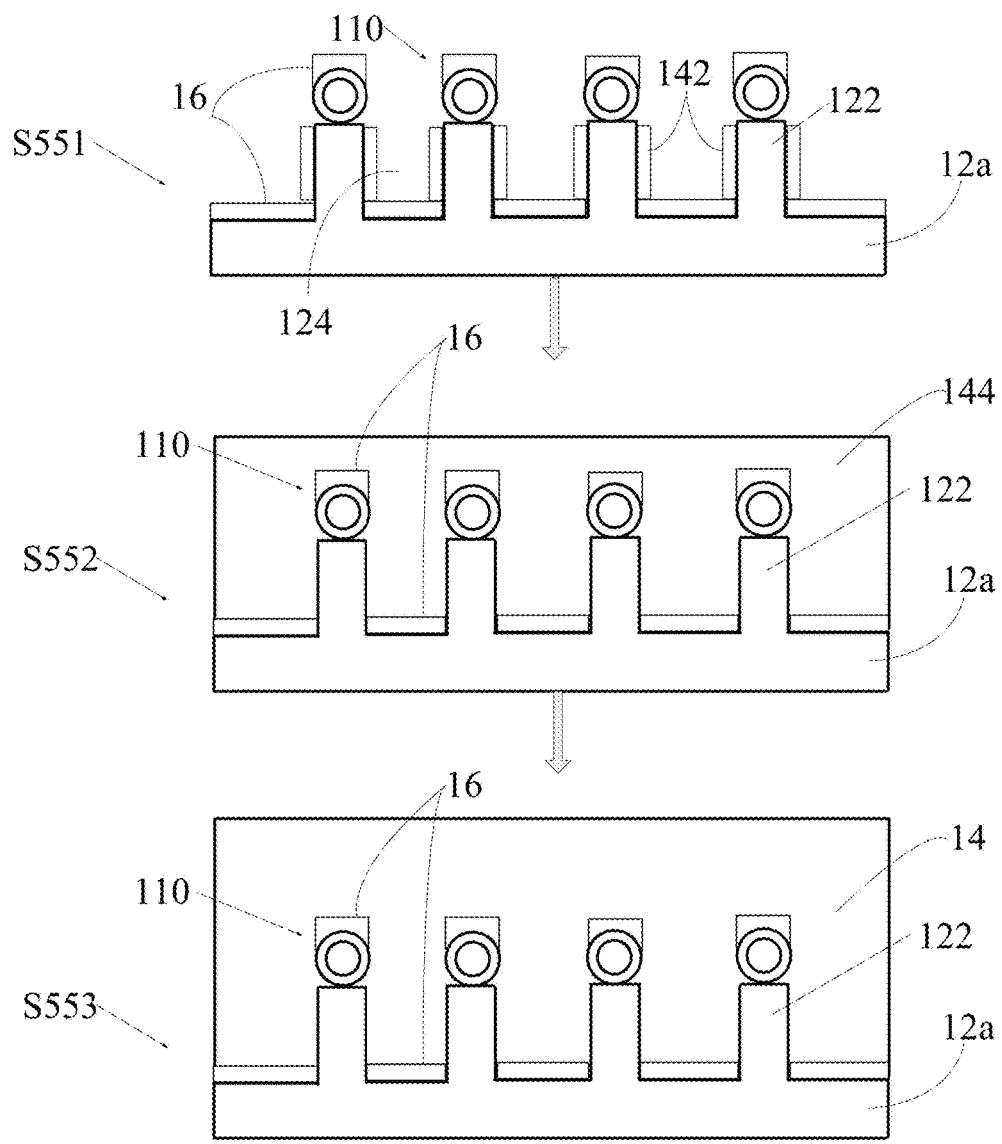
FIG. 27 is a flowchart of one exemplary embodiment of a process of growing a GaN epitaxial layer on the patterned silicon substrate.

Referring to FIG. 27, step (S55) includes the following substeps:

step (S551), nucleating and laterally growing a plurality of epitaxial crystal grains 142 on the side surface of the bulged pattern 122 along the direction substantially parallel to the bottom surface of the plurality of holes 124;

step (S552), forming a continuous epitaxial film 144 by vertically growing the epitaxial crystal grains 142 along the direction substantially perpendicular to the bottom surface of the plurality of holes 124 and then joining the epitaxial crystal grains 142; and step (S553), forming the GaN epitaxial layer 14 by making the epitaxial film 144 vertically grow along the direction substantially perpendicular to the bottom surface of the plurality of holes 124.

It is to be understood that the above-described exemplary embodiments are intended to illustrate rather than limit the disclosure. Any elements described in accordance with any exemplary embodiments is understood that they can be used in addition or substituted in other exemplary embodiments. Exemplary embodiments can also be used together. Variations may be made to the exemplary embodiments without departing from the spirit of the disclosure. The above-described exemplary embodiments illustrate the scope of the disclosure but do not restrict the scope of the disclosure.

Depending on the exemplary embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method for making a GaN epitaxial layer, the method comprising:

providing a silicon substrate;

providing a carbon nanotube structure, wherein the carbon nanotube structure defines a plurality of openings;

forming the carbon nanotube structure on a surface of the silicon substrate, wherein portions of the surface of the silicon substrate are exposed from the plurality of openings to form a first exposed surface;

forming a patterned silicon substrate having a bulged pattern by dry etching the first exposed surface using the carbon nanotube structure as a mask, wherein the bulged pattern comprises a plurality of strip-shaped bulges; and epitaxially growing a gallium nitride (GaN) epitaxial layer on the patterned silicon substrate.

2. The method of claim 1, wherein providing the carbon nanotube structure comprises stacking a plurality of carbon nanotube films.

3. The method of claim 2, wherein each of the plurality of carbon nanotube films comprises a plurality of carbon nanotubes joined end-to-end and arranged along the same direction.

4. The method of claim 3, wherein the plurality of strip-shaped bulges intersect with each other.

5. The method of claim 1, wherein the carbon nanotube structure is kept on the bulged pattern during the epitaxial growth of the GaN epitaxial layer on the patterned silicon substrate.

6. The method of claim 1, further comprising removing the carbon nanotube structure from the patterned silicon substrate before epitaxially growing the GaN epitaxial layer on the patterned silicon substrate.

7. The method of claim 1, further comprising depositing a baffle layer to cover both the carbon nanotube structure and the bulged pattern before epitaxially growing the GaN epitaxial layer on the patterned silicon substrate.

8. The method of claim 7, wherein the bulged pattern defines a plurality of holes; a first portion of the baffle layer is deposited on a surface of the carbon nanotube structure, and a second portion of the baffle layer is deposited on bottom surfaces of the plurality of holes.

9. The method of claim 8, further comprising removing the first portion of the baffle layer and the carbon nanotube structure before epitaxially growing the GaN epitaxial layer on the patterned silicon substrate.

10. The method of claim 8, wherein a thickness of the baffle layer is less than a height of the bulged pattern so that side surface of the bulged pattern is exposed, and both the baffle layer and the carbon nanotube structure are kept on the patterned silicon substrate during the epitaxial growth of the GaN epitaxial layer on the patterned silicon substrate.

11. A method for making a GaN epitaxial layer, the method comprising:
 providing a silicon substrate;
 providing a carbon nanotube composite structure, wherein the carbon nanotube structure comprises a carbon nanotube structure and a protective layer coated on the carbon nanotube structure, and the carbon nanotube structure comprises a plurality of carbon nanotubes intersected with each other and defines a plurality of openings;
 forming the carbon nanotube composite structure on a surface of the silicon substrate, wherein portions of the surface of the silicon substrate are exposed from the plurality of openings to form a first exposed surface;
 forming a patterned silicon substrate having a bulged pattern by dry etching the first exposed surface using the carbon nanotube composite structure as a mask, wherein the bulged pattern comprises a plurality of strip-shaped bulges; and
 epitaxially growing a gallium nitride (GaN) epitaxial layer on the patterned silicon substrate.

12. The method of claim 11, wherein each of the plurality of carbon nanotubes is entirely enclosed by the protective layer.

13. The method of claim 11, wherein the carbon nanotube composite structure is kept on the bulged pattern during the epitaxial growth of the GaN epitaxial layer on the patterned silicon substrate.

14. The method of claim 11, further comprising removing the carbon nanotube composite structure from the patterned silicon substrate before epitaxially growing the GaN epitaxial layer on the patterned silicon substrate.

15. The method of claim 11, further comprising depositing a baffle layer to cover both the carbon nanotube composite structure and the bulged pattern before epitaxially growing the GaN epitaxial layer on the patterned silicon substrate.

16. The method of claim 15, wherein the bulged pattern defines a plurality of holes; a first portion of the baffle layer is deposited on a surface of the carbon nanotube composite structure, and a second portion of the baffle layer is deposited on bottom surfaces of the plurality of holes.

17. The method of claim 16, further comprising removing the first portion of the baffle layer and the carbon nanotube composite structure before epitaxially growing the GaN epitaxial layer on the patterned silicon substrate.

18. A method for making a GaN epitaxial layer, the method comprising:
 forming a carbon nanotube composite structure on a surface of a silicon substrate, wherein the carbon nanotube composite structure comprises a plurality of carbon nanotubes intersected with each other and defines a plurality of openings, each of the plurality of carbon nanotubes is coated by a protective layer, and portions of the surface of the silicon substrate are exposed from the plurality of openings to form a first exposed surface;
 forming a patterned silicon substrate having a bulged pattern by dry etching the first exposed surface using the carbon nanotube composite structure as a mask, wherein the bulged pattern comprises a plurality of strip-shaped bulges; and
 epitaxially growing a gallium nitride (GaN) epitaxial layer on the patterned silicon substrate.

19. The method of claim 18, wherein a width of the plurality of strip-shaped bulges is in a range from about 20 nanometers to about 100 nanometers; a distance between every two adjacent strip-shaped bulges of the plurality of strip-shaped bulges is in a range from about 10 nanometers to about 300 nanometers; and a height of the plurality of strip-shaped bulges is in a range from about 50 nanometers to about 1000 nanometers.

20. The method of claim 18, wherein the plurality of strip-shaped bulges comprises a plurality of first strip-shaped bulges and a plurality of second strip-shaped bulges; the plurality of first strip-shaped bulges are substantially parallel with each other and extends along a first direction, and the plurality of second strip-shaped bulges are substantially parallel with each other and extends along a second direction different from the first direction; and an angle between the first direction and the second direction is greater than 30 degrees and less than or equal to 90 degrees.

* * * * *